United States Patent
Wise et al.

(10) Patent No.: US 10,911,031 B2
(45) Date of Patent: Feb. 2, 2021

(54) SUPERCONDUCTING CIRCUIT FOR PROCESSING INPUT SIGNALS

(71) Applicant: Microsoft Technology Licensing, LLC, Redmond, WA (US)

(72) Inventors: James F. Wise, Baltimore, MD (US); Jonathan D. Egan, Hanover, MD (US); Haitao O. Dai, Bluebell, PA (US); Quentin P. Herr, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 10 days.

(21) Appl. No.: 16/269,739

(22) Filed: Feb. 7, 2019

(65) Prior Publication Data

US 2020/0259483 A1 Aug. 13, 2020

(51) Int. Cl.
| | |
|---|---|
| *H03K 19/195* | (2006.01) |
| *H03M 5/02* | (2006.01) |
| *H03K 3/012* | (2006.01) |
| *H01F 6/06* | (2006.01) |
| *H01P 3/00* | (2006.01) |
| *H03M 5/06* | (2006.01) |
| *H04B 1/04* | (2006.01) |

(52) U.S. Cl.
CPC .............. *H03K 3/012* (2013.01); *H01F 6/06* (2013.01); *H01P 3/00* (2013.01); *H03K 19/195* (2013.01); *H03M 5/02* (2013.01); *H03M 5/06* (2013.01); *H04B 1/04* (2013.01)

(58) Field of Classification Search
CPC .......... H03F 1/0277; H03F 3/189; H03F 3/21; H03F 2200/435; H02M 7/04; H03H 7/0161; H04B 1/0475; H03M 5/02; H03M 5/06; H03K 19/195
See application file for complete search history.

(56) References Cited

U.S. PATENT DOCUMENTS

| | | | |
|---|---|---|---|
| 5,963,351 A | 10/1999 | Kaplounenko et al. | |
| 6,483,339 B1 * | 11/2002 | Durand | H03K 19/1952 326/5 |

(Continued)

FOREIGN PATENT DOCUMENTS

JP S60199216 A 10/1985

OTHER PUBLICATIONS

Herr, et al., "Ultra-Low-Power Superconductor Logic", In the Repository of arXiv:1103.4269, Mar. 22, 2011, 7 Pages.

(Continued)

*Primary Examiner* — Dinh T Le
(74) *Attorney, Agent, or Firm* — Ranjeev Singh; Singh Law, PLLC

(57) ABSTRACT

Superconducting circuits for processing input signals are described. An example superconducting circuit includes a first portion configured to receive an input signal having a data pattern represented by edge transitions in the input signal. The superconducting circuit further includes a second portion configured to provide an output signal, where the superconducting circuit is configured to, without applying a direct-current (DC) offset to the input signal, output the output signal corresponding to the edge transitions such that the output signal is substantially representative of the data pattern despite not applying the DC offset to the input signal.

20 Claims, 5 Drawing Sheets

(56) References Cited

U.S. PATENT DOCUMENTS

| | | | |
|---|---|---|---|
| 7,151,382 B1* | 12/2006 | Kean | G01R 21/07 |
| | | | 324/683 |
| 7,959,552 B2* | 6/2011 | Jordan | A61F 2/00 |
| | | | 128/903 |
| 10,243,582 B1* | 3/2019 | Herr | G06N 10/00 |
| 2007/0052441 A1 | 3/2007 | Taguchi et al. | |
| 2011/0254583 A1 | 10/2011 | Herr | |
| 2019/0305594 A1* | 10/2019 | Tachiwa | H04M 1/7253 |

OTHER PUBLICATIONS

"International Search Report and Written Opinion Issued in PCT Application No. PCT/US20/015506", dated May 14, 2020, 21 Pages.

* cited by examiner

SUPERCONDUCTING CIRCUIT FOR PROCESSING INPUT SIGNALS

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits. Superconducting circuits may be used for processing input signals, including signals with a variable data rate.

SUMMARY

In one example, the present disclosure relates to a superconducting circuit comprising a first portion configured to receive an input signal having a data pattern represented by edge transitions in the input signal. The superconducting circuit may further include a second portion configured to provide an output signal, where the superconducting circuit is configured to, without applying a direct-current (DC) offset to the input signal, output the output signal corresponding to the edge transitions such that the output signal is substantially representative of the data pattern despite not applying the DC offset to the input signal.

In another aspect, the present disclosure relates to a superconducting circuit comprising a receiver circuit comprising a transformer including a primary winding of the transformer, coupled to receive the input signal, and a secondary winding of the transformer, where the receiver circuit further comprises a resistor coupled between the secondary winding of the transformer and a ground terminal, where the receiver circuit is configured to receive an input signal having a data pattern represented by edge transitions in the input signal, and where the receiver circuit is configured to output an intermediate signal, via a first node, corresponding to the edge transitions such that the intermediate signal is substantially representative of the data pattern. The superconducting circuit may further include an input transmission circuit coupled to the first node to receive the intermediate signal and provide single flux quantum (SFQ) pulses to a second node. The superconducting circuit may further include a reflection circuit coupled to the second node to receive the SFQ pulses and provide inverted SFQ pulses to the second node. The superconducting circuit may further include an output transmission circuit coupled to the second node to receive both the SFQ pulses and the inverted SFQ pulses and provide the SFQ pulses and the inverted SFQ pulses as an output signal.

In yet another aspect, the present disclosure relates to a superconducting circuit comprising a receiver circuit configured to receive an input signal having a data pattern represented by edge transitions in the input signal, where the receiver circuit is configured to, without applying a direct-current (DC) offset to the input signal, output an intermediate signal, via a first node, corresponding to the edge transitions such that the intermediate signal is substantially representative of the data pattern despite not applying the DC offset to the input signal. The superconducting circuit may further include an output transmission circuit comprising a plurality of Josephson transmission lines, where the output transmission circuit is coupled to the first node to receive the intermediate signal and provide an output signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
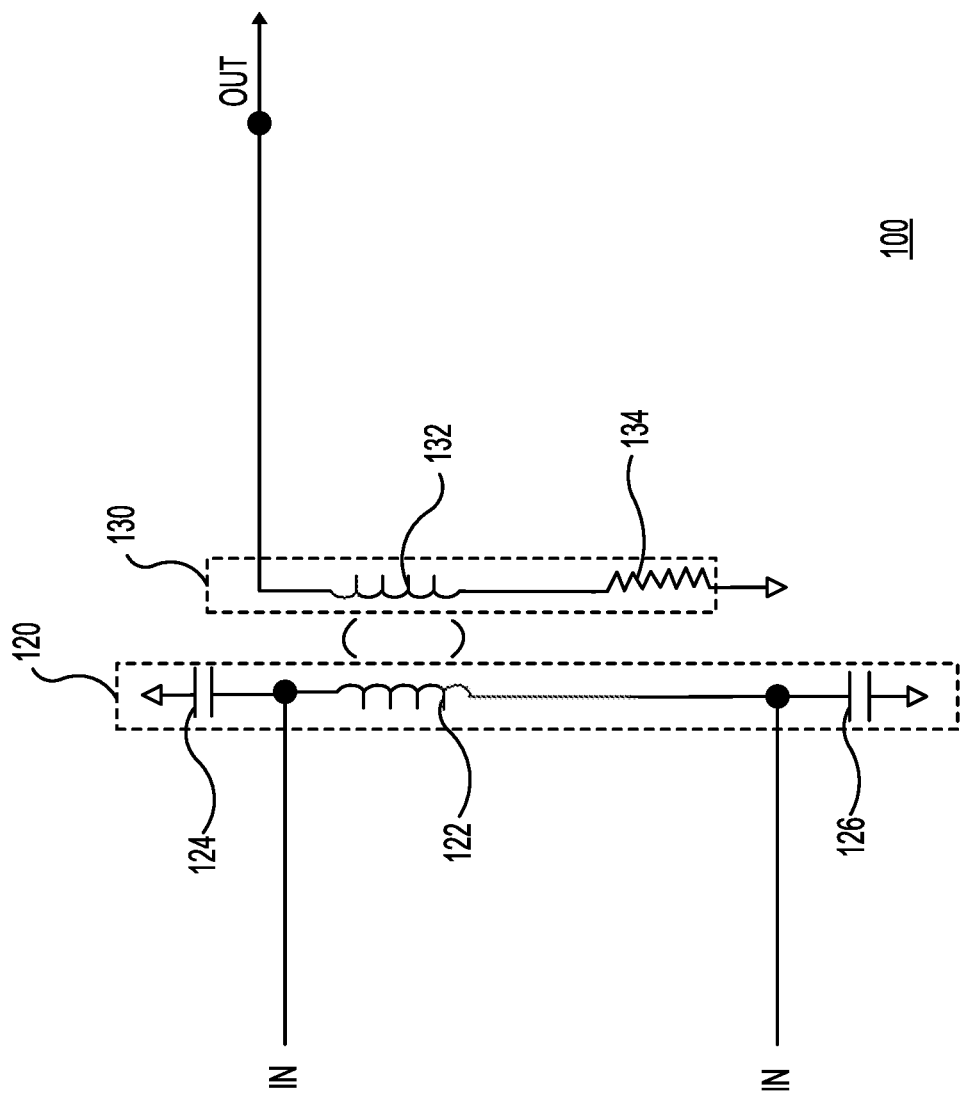
FIG. 1 is a diagram of a superconducting input circuit for processing input signals, including signals having a variable data rate, in accordance with one example.

Examples described in this disclosure relate to superconducting circuits for processing input signals, including input signals with a variable data rate. Certain examples described in this disclosure relate to reciprocal quantum logic (RQL) circuits that may be implemented using wave pipelined logic or phase-mode logic. Such RQL circuits may act as low-power superconductor logic circuits.

Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Certain examples described in this disclosure relate to processing input signals with a variable data rate. Such input signals may include non-return to zero (NRZ) encoded input signals or return to zero (RZ) encoded input signals. In certain examples, the input signals may be NRZ signals received from non-superconducting circuits (e.g., CMOS-based circuits that are not required to be cooled to the same extent as the superconducting circuits). The output signals may be RZ signals, such as reciprocal quantum logic (RQL) signals. Certain examples may refer to the superconducting circuits as receivers when such circuits are used to receive input signals from other circuits, such as non-superconducting circuits. Such input receivers may require a DC offset to the primary winding to ensure enough current through the primary winding. As an example, a DC offset may be a digital signal with an amplitude multiplied by the transformer coupling coefficient. The output signal (e.g., a series of RZ single flux quantum (SFQ) pulses) requires a positive current for the logic high pulse and a negative current for the logic low pulse. These output pulses may be received by an RQL Josephson transmission line (JTL). The DC offset may cause the positive current to be higher, in terms of an absolute amplitude value, than the negative current.

In addition, input receivers have difficulty handling input signals with a decaying amplitude. As an example, if the input signal were to droop, the receiver may interpret that as a falling edge. As another example, an input NRZ signal may retain a logic high position for a long time or alternatively the input NRZ signal may retain a logic low position for a long time. This variability in the input data pattern may further vitiate the effects of the DC offset. Any changes in the amplitude of the current may pass through the transformer to the JTL causing the JTL to be under-biased or over-biased resulting in potential data loss.

Certain systems may include DC blocking capacitors placed between the non-superconducting drive amplifier (on the warm side) and the RQL JTL. The capacitance associated with such DC blocking capacitors may act as a high-pass filter and may reject long series of logic high values (e.g., logic 1s) in the input signal. In addition, this capacitance may cause the input waveform to decay (or droop) resulting in the high and the low amplitudes of the input waveform to vary.

Certain examples relate to preventing (or at least reducing) the occurrence of data loss as a result of the variability of input data pattern using a superconducting input circuit. The superconducting input circuit coupled to the RQL JTL may be a transformer including a superconducting primary winding and a non-superconducting secondary winding. In certain examples, a small resistor may be inserted in the secondary winding of the transformer whose primary winding is coupled to receive the input signal. The presence of the small resistor may break the superconducting loop so that only an alternating current (AC) waveform is observed at the output of the transformer. In this way, advantageously, only sudden changes in the input data signal (e.g., the rising or the falling edge of the input data pattern) may be seen by the secondary winding as an AC signal. In this way, the input receiver may be edge triggered by signal transitions with sufficient slew rate. In certain examples, the slew rate's time constant may be designed into the input receiver allowing it to provide proper RQL output by triggering only on transitions associated with the changes in the data signal while rejecting droop. No DC offset of the input signal may be required. Advantageously, the lack of a required DC offset current may reduce overall energy consumption. In addition, the labor hours required to fine tune the circuit in view of the DC offset may be eliminated.

FIG. 1 is a diagram of a superconducting input circuit 100 for processing input signals, including signals having a variable data rate, in accordance with one example. Superconducting input circuit 100 may be configured to receive input signals via the input terminal (IN) and provide output signals via the output terminal (OUT). Superconducting input circuit 100 may include a first portion 120 and a second portion 130. First portion 120 of superconducting input circuit 100 may include a primary transformer winding 122, a first capacitor 124, and a second capacitor 126. Each of the capacitors may be coupled to a ground terminal. Second portion 130 may include a secondary winding 132. Primary winding 122 and secondary winding 132 may form a transformer. Second portion 130 of superconducting input circuit 100 may further include a resistor 134 coupled between secondary winding 132 and the ground terminal. The output of superconducting input circuit 100 may be coupled to a circuit including Josephson transmission lines (JTLs) (not shown in FIG. 1). Although FIG. 1 shows a certain number of components of superconducting integrated circuit 100 arranged in a certain manner, there could be more or fewer number of components arranged differently.

Figure 2:
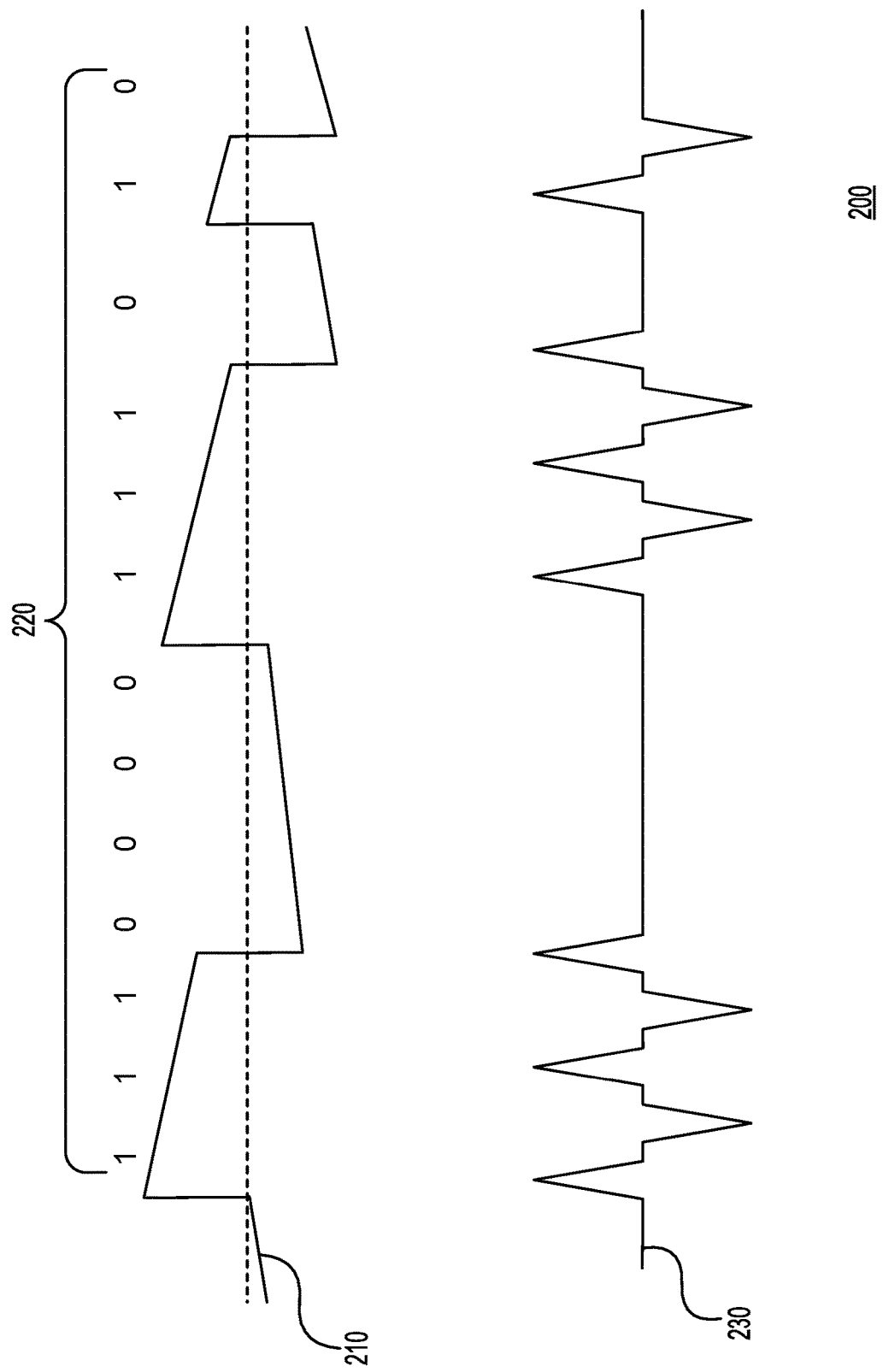
FIG. 2 is a diagram showing waveforms associated with the superconducting circuit of FIG. 1.

The operation of superconducting input circuit 100 is explained with the help of FIG. 2, which is a diagram showing example waveforms 200 associated with the superconducting input circuit 100 of FIG. 1. In this example, waveform 210 represents a non-return to zero signal received as an input signal by superconducting input circuit 100. In one example, the input signal may be received from the warm side (e.g., non-superconducting side) of the system that includes both superconducting and non-superconducting components.

Waveform 210 corresponds to the data pattern 220 shown above waveform 210 in FIG. 2. The edge to edge transitions of the input signal received via primary winding 122 of FIG. 1 may be seen as an output current at primary winding 122. That output current, when sufficient, may generate an output signal represented by waveform 230. In this example, waveform 230 shows the output signal encoded in reciprocal quantum logic (RQL). The output signal includes a series of single flux quantum (SFQ) pulses, including positive and negative SFQ pulses. To ensure proper operation of superconducting input circuit 100, the value of the inductance (L) associated with secondary winding 132 and the value of the resistance (R) associated with resistor 134 may be configured to have a desirable ratio expressed in the form L/R time constant. In this example, the L/R time constant associated with second portion 130 of superconducting input circuit 100 may be selected such that only the edge to edge transitions in the input signal generate enough current in secondary winding 132 for it to be output as the output signal. This way only rising/falling edges of the input signal may generate an output signal that can be detected and processed by superconducting input circuit 100. Other changes in the input signal, such as droop, may be ignored. This way superconducting input circuit 100 may be configured to, without applying a direct-current (DC) offset to input portion 110, output the output signal corresponding to the edge transitions such that the output signal is substantially representative of the data pattern despite not applying any DC offset to the input portion that may modify the input signal.

Figure 3:
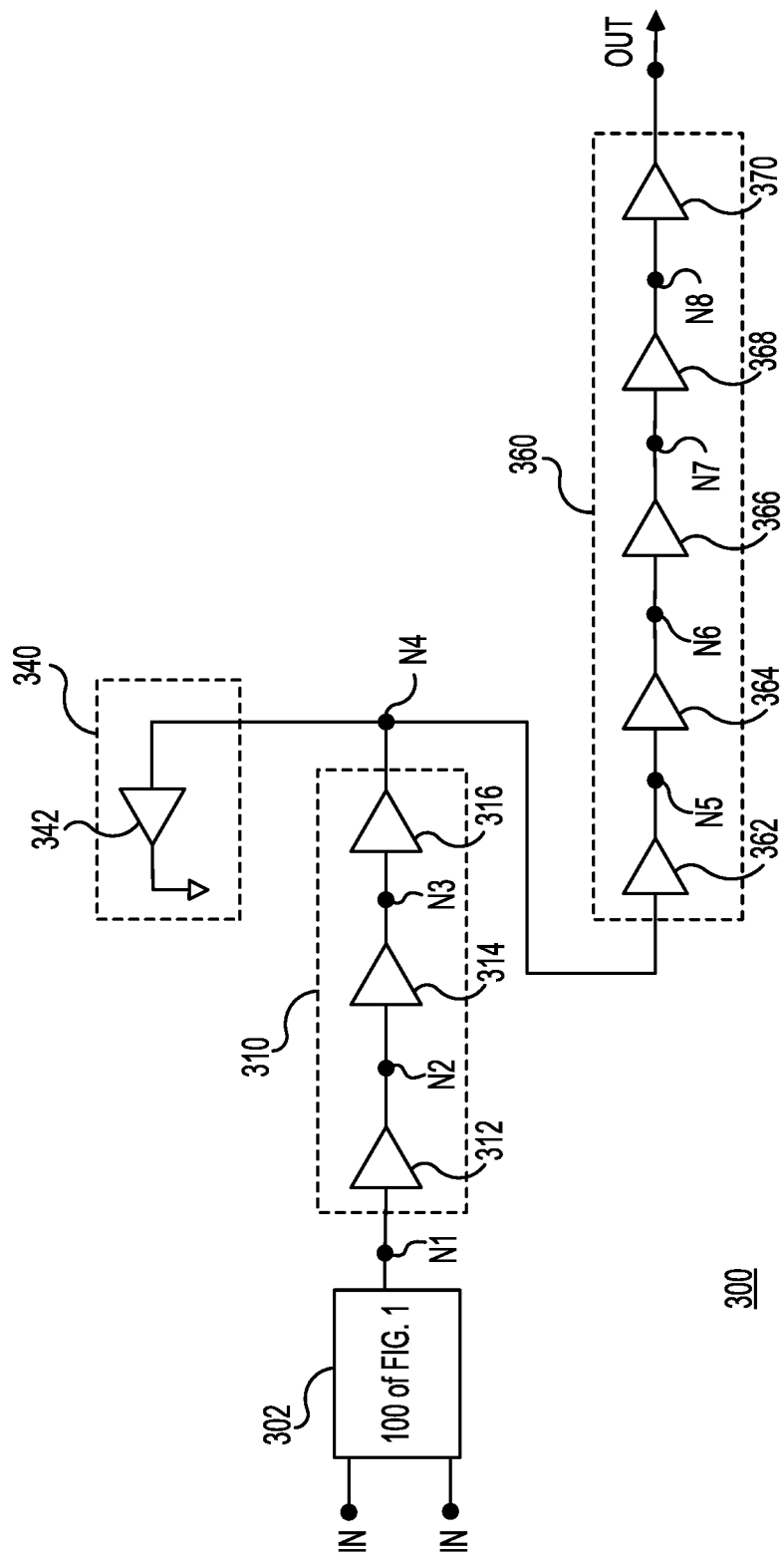
FIG. 3 is a diagram of another superconducting circuit for processing input signals, including signals having a variable data rate, in accordance with one example.

FIG. 3 is a diagram of another superconducting circuit 300 for processing input signals, including signals having a variable data rate, in accordance with one example. Superconducting circuit 300 may include a receiver circuit 302, which may be implemented as superconducting input circuit 100 of FIG. 1. Receiver circuit 302 may be configured to receive input signals via an input terminal (e.g., IN). Superconducting circuit 300 may further include an input transmission circuit 310, a reflection circuit 340, and an output transmission circuit 360. Input transmission circuit 310 may be coupled to receiver circuit 302 via node N1. Input transmission circuit 310 may be coupled to reflection circuit 340 and output transmission circuit 360 at node N6. Input transmission circuit 310 may include a Josephson transmission line (JTL) 312 coupled between the node N1 and node N2. Input transmission circuit 310 may further include a JTL 314 coupled between the node N2 and node N3. Input transmission circuit 310 may further include JTL 316 coupled between the node N3 and node N4. JTL 312 and JTL 314 may be in the same phase group (e.g., Phase Group A) such that each of these JTLs receive clock signals having the same phase. As an example, JTL 312 and JTL 314 may be coupled to a clock line carrying an AC signal having a phase of −270 degrees. Reflection circuit 340 may be coupled to the node N4 and may include a JTL 342. JTL 316 and JTL 342 may be in the same phase group (e.g., Phase Group B) such that each of these JTLs receive clock signals having the same phase. JTL 316 and JTL 342 may be coupled to a clock line carrying an AC signal having a phase of −180 degrees. Thus, in this example, input transmission circuit 310 may be configured to provide two phase boundaries between receiver circuit 302 and reflection circuit 340. At a phase boundary—where Josephson junctions may be coupled to a clock having a different phase—earlier arrived pulses will need to wait until the rise of the clock signal in the next phase.

Still referring to FIG. 3, output transmission circuit 360 may include a JTL 362 coupled between the node N4 and node N5. JTL 362 may be part of the Phase Group B, such that it may be coupled to a clock line carrying an AC signal having a phase of −180 degrees. Output transmission circuit 360 may further include a JTL 364 coupled between the node N5 and node N6. Output transmission circuit 360 may further include a JTL 366 coupled between the node N6 and node N7. JTL 364 and JTL 366 may be part of Phase Group C. Thus, in this example, JTL 364 and JTL 366 may be coupled to a clock line carrying an AC signal having a phase of −90 degrees. Output transmission circuit 360 may further include a JTL 368 coupled between the node N7 and node N8. Output transmission circuit 360 may further include a JTL 370 coupled between the node N8 and the output terminal (OUT). JTL 368 and 370 may be part of Phase Group D. Thus, in this example, JTL 368 and JTL 370 may be coupled to a clock line carrying a clock signal having a phase of 0 degrees. Although FIG. 3 shows a certain number of components of superconducting integrated circuit 300 arranged in a certain manner, there could be more or fewer number of components arranged differently. In addition, although the description related to FIG. 3 refers to certain phase groups and certain phase values associated with the clock signals received by the various JTLs, the JTLs need not be in those specific phase groups, and the clock signals need not have the specific phase values. Instead, any phase values that are selected to perform the functionality associated with each of input transmission circuit 310, reflection circuit 340, and output transmission circuit 360 may be used.

With continued reference to FIG. 3, in terms of the operation of superconducting circuit 300, an edge transition in the input signal (e.g., a transition from a logic low value to a logic high value, which then stays high) may generate an SFQ pulse at the output of receiver circuit 302. The SFQ pulse may travel through input transmission circuit 310 to node N4 and split such that an SFQ pulse goes toward reflection circuit 340, and is stored there, and another SFQ pulse goes through output transmission circuit 360 to the output terminal (OUT). After a certain time (e.g., half a clock cycle) later, the stored SFQ pulse in reflection circuit 340 appears at node N4 as a negative SFQ pulse (e.g., an inverted SFQ pulse) and is transmitted to the output terminal vial output transmission circuit 360. An input signal having a data represented edge transitions in the input signal may result in superconducting circuit 300 outputting a series of SFQ pulses, including both positive and negative SFQ pulses. In one example, each negative SFQ pulse may trail a positive SFQ pulse by half a clock cycle. The two phase boundaries between receiver circuit 302 and reflection circuit 340 may ensure that the SFQ pulses being reflected from reflection circuit 340 do not get back to receiver circuit 302. As explained earlier, the phase boundaries are created by using a certain number of JTLs that receive clock signals with different phase values. Thus, in this example, superconducting circuit 300 is configured to receive a non-return to zero (NRZ) signal and provide a return to zero (RZ) signal (e.g., both positive and negative SFQ pulses) as an output.

Figure 4:
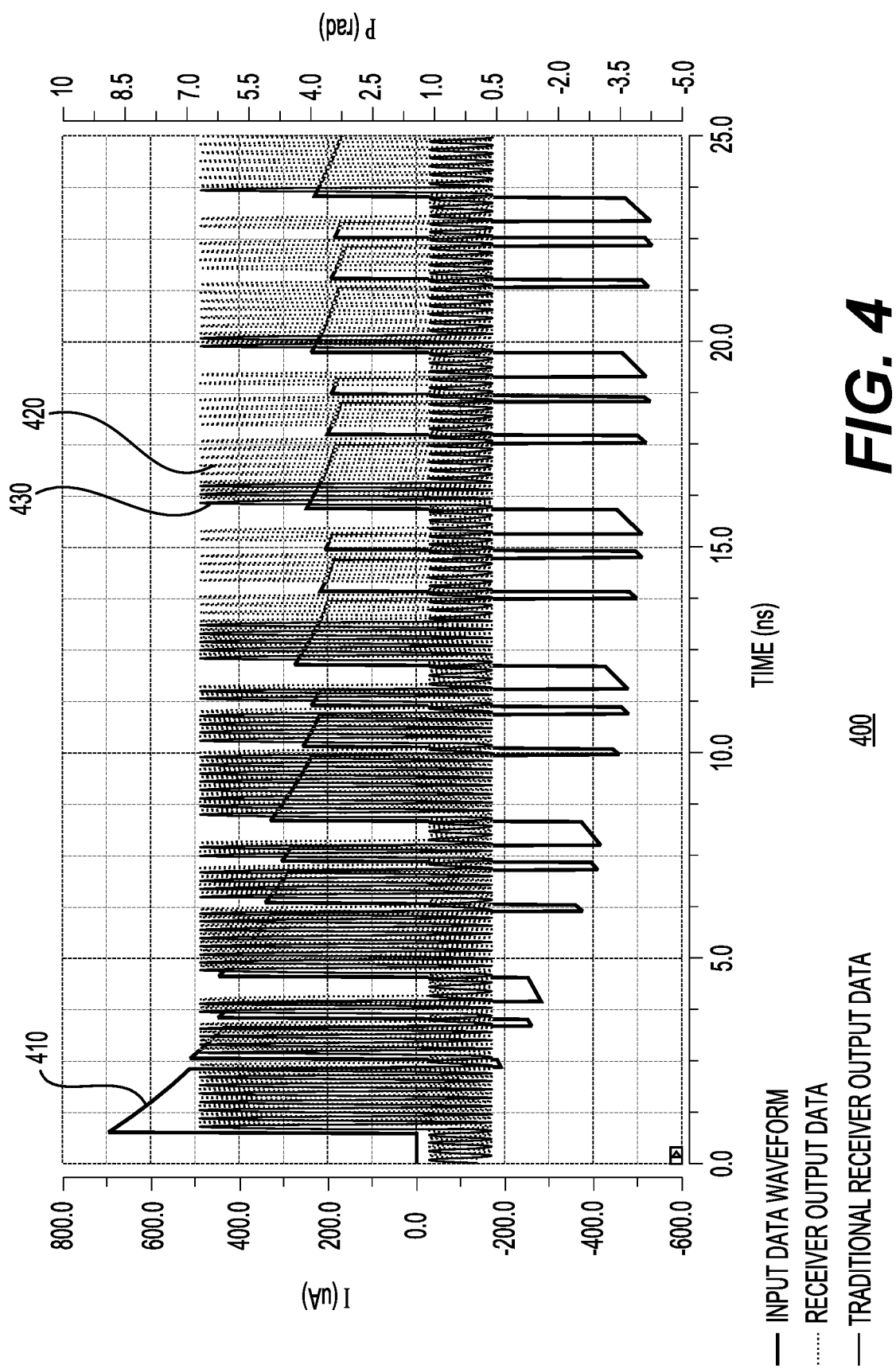
FIG. 4 is a diagram showing waveforms associated with the superconducting circuit of FIG. 3 in accordance with one example.

FIG. 4 is a diagram showing waveforms 400 associated with the superconducting circuit 300 of FIG. 3 in accordance with one example. Waveform 410 represents an example measurement of the current associated with an input signal received by superconducting circuit 300. Waveform 420 represents an example measurement of the phase of an output signal provided by superconducting circuit 300. Waveform 430 represents an example measurement of an output signal provided by a traditional receiver that does not include the improvements to circuitry described as part of superconducting circuit 300. As shown in FIG. 4, the output signal represented by waveform 430 shows missing changes in phase in the output signal even though the input signal includes edge transitions representative of the data pattern in the input signal. This is because, in this example, when the absolute magnitude of the input signal corresponding to logical "0" value becomes greater than the absolute magnitude of the input signal corresponding to logical "1" value, the traditional receiver becomes under biased and the traditional receiver fails to output data that is representative of the data pattern represented by edge transitions in the input signal. In contrast, the output signal represented by waveform 420 is substantially representative of the data pattern in the input signal despite not applying a DC offset to the input signal. In this example, substantially representative refers to the fact that if the output signal were to be processed (e.g., decoded) to determine the data pattern represented by edge transitions in the input signal processed by the receiver, the data pattern will be the same as the received data pattern except for any transient errors that might have been caused by noise, interference, or other such artifacts.

Figure 5:
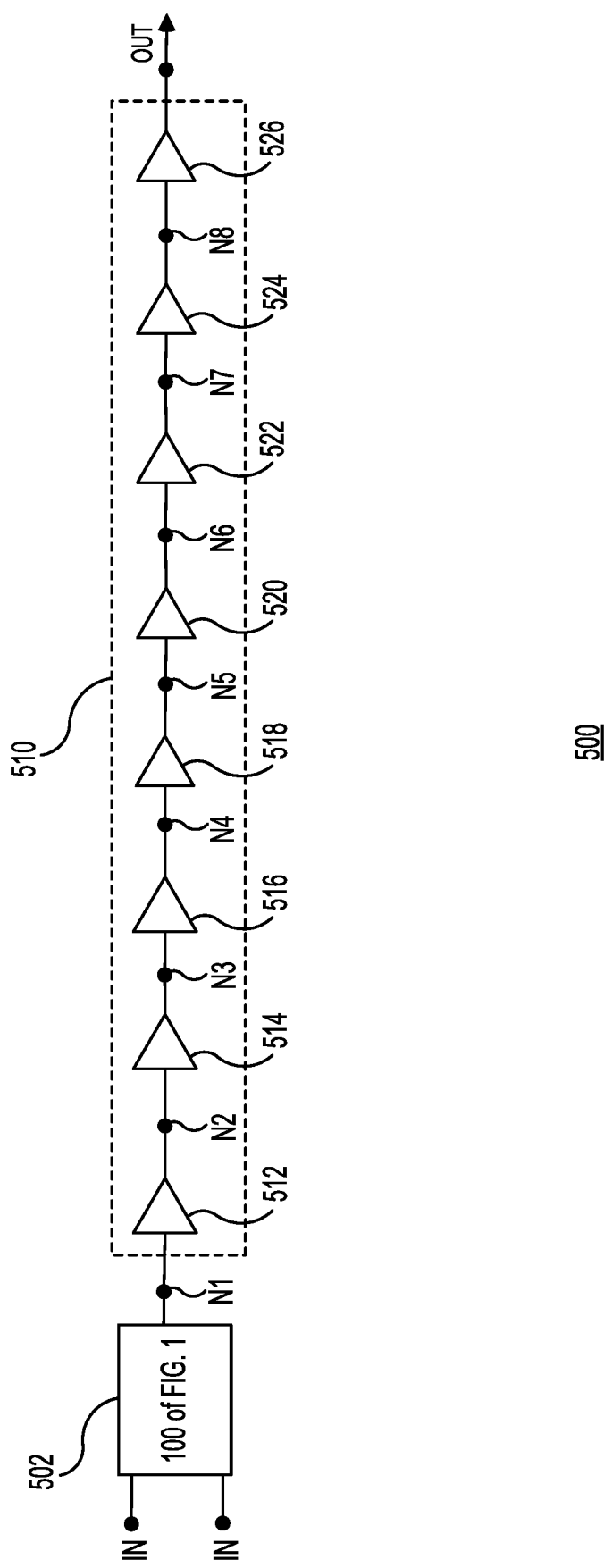
FIG. 5 is a diagram of another superconducting circuit for processing input signals, including signals having a variable data rate, in accordance with one example.

FIG. 5 is a diagram of another superconducting circuit 500 for processing input signals, including signals having a variable data rate, in accordance with one example. Superconducting circuit 500 may include a receiver circuit 502, which may be implemented as superconducting input circuit 100 of FIG. 1. Receiver circuit 502 may be configured to receive input signals via an input terminal (e.g., IN). Superconducting circuit 500 may further include an output transmission circuit 510. Output transmission circuit 510 may be coupled to receiver circuit 502 via node N1. Output transmission circuit 510 may include a Josephson transmission line (JTL) 512 coupled between the node N1 and node N2. Output transmission circuit 510 may further include a JTL 514 coupled between the node N2 and node N3. Output transmission circuit 510 may further include a JTL 516 coupled between the node N3 and node N4. Output transmission circuit 510 may further include a JTL 518 coupled between the node N4 and node N5. Output transmission circuit 510 may further include a JTL 520 coupled between the node N5 and node N6. Output transmission circuit 510 may further include a JTL 522 coupled between the node N6 and node N7. Output transmission circuit 510 may further include a JTL 524 coupled between the node N7 and node N8. Output transmission circuit 510 may further include a JTL 526 coupled between the node N8 and an output terminal (OUT). JTL 512 and JTL 514 may be in the same phase group (e.g., Phase Group A) such that each of these JTLs may receive clock signals having the same phase. As an example, JTL 512 and JTL 354 may be coupled to a clock line carrying an AC signal having a phase of −270 degrees. JTL 516 and JTL 518 may be in the same phase group (e.g., Phase Group B) such that each of these JTLs may receive clock signals having the same phase. In this example, JTL 516 and JTL 518 may be coupled to a clock line carrying an AC signal having a phase of −180 degrees.

With continued reference to FIG. 5, JTL 520 and JTL 522 may be in the same phase group (e.g., Phase Group C) such that each of these JTLs may receive clock signals having the same phase. In this example, JTL 520 and JTL 522 may be coupled to a clock line carrying an AC signal having a phase of −90 degrees. JTL 524 and JTL 526 may be in the same phase group (e.g., Phase Group D) such that each of these JTLs may receive clock signals having the same phase. In this example, JTL 524 and JTL 526 may be coupled to a clock line carrying an AC signal having a phase of 0 degrees. Thus, in this example, output transmission circuit 510 may be configured to include three phase boundaries separating the four phase groups. As noted earlier, at a phase boundary—where Josephson junctions may be coupled to a clock having a different phase—earlier arrived pulses will need to wait until the rise of the clock signal in the next phase. Although FIG. 5 shows a certain number of components of superconducting circuit 500 arranged in a certain manner, there could be more or fewer number of components arranged differently. In addition, although the description related to FIG. 5 refers to certain phase groups and certain phase values associated with the clock signals received by the various JTLs, the JTLs need not be in those specific phase groups, and the clock signals need not have the specific phase values. Instead, any phase values that are selected to perform the functionality associated with output transmission circuit 510 may be used.

In terms of the operation of superconducting circuit 500, the output signal at the OUT terminal is substantially representative of the data pattern in the input signal despite not applying a DC offset to the input signal. In this example, substantially representative refers to the fact that if the output signal were to be processed to determine the data pattern represented by edge transitions in the input signal processed by the receiver, the data pattern will be the same as the received data pattern except for any transient errors that might have been caused by noise, interference, or other such artifacts. In addition, superconducting circuit 500 is configured such that it may provide a return to zero (RZ) signal as an output if the input signal is also an RZ signal. Similarly, superconducting circuit 500 is configured such that it may provide a non-return to zero (NRZ) signal as an output if the input signal is also an NRZ signal.

In conclusion, the present disclosure relates to a superconducting circuit comprising a first portion configured to receive an input signal having a data pattern represented by edge transitions in the input signal. The superconducting circuit may further include a second portion configured to provide an output signal, where the superconducting circuit is configured to, without applying a direct-current (DC)

offset to the input signal, output the output signal corresponding to the edge transitions such that the output signal is substantially representative of the data pattern despite not applying the DC offset to the input signal.

The superconducting circuit may include a transformer. The first portion may comprise a primary winding of the transformer. The second portion may comprise a secondary winding of the transformer and a resistor coupled between the secondary winding of the transformer and a ground terminal. The ratio of an inductance of the secondary winding and a resistance of the resistor may be selected such that only the edge transitions in the input signal generate enough current in the secondary winding for it to be output as the output signal.

The superconducting circuit may be configured to output the output signal corresponding to the edge transitions in the input signal regardless of variability of the data pattern. The input signal may comprise a non-return to zero signal and the output signal comprises a return to zero signal. The non-return to zero signal may comprises a signal generated by a non-superconducting system and the return to zero signal comprises single flux quantum (SFQ) pulses.

In another aspect, the present disclosure relates to a superconducting circuit comprising a receiver circuit comprising a transformer including a primary winding of the transformer, coupled to receive the input signal, and a secondary winding of the transformer, where the receiver circuit further comprises a resistor coupled between the secondary winding of the transformer and a ground terminal, where the receiver circuit is configured to receive an input signal having a data pattern represented by edge transitions in the input signal, and where the receiver circuit is configured to output an intermediate signal, via a first node, corresponding to the edge transitions such that the intermediate signal is substantially representative of the data pattern. The superconducting circuit may further include an input transmission circuit coupled to the first node to receive the intermediate signal and provide single flux quantum (SFQ) pulses to a second node. The superconducting circuit may further include a reflection circuit coupled to the second node to receive the SFQ pulses and provide inverted SFQ pulses to the second node. The superconducting circuit may further include an output transmission circuit coupled to the second node to receive both the SFQ pulses and the inverted SFQ pulses and provide the SFQ pulses and the inverted SFQ pulses as an output signal.

The input transmission circuit may be configured to block the inverted SFQ pulses from reaching the receiver circuit. The input transmission circuit may comprise a plurality of Josephson transmission lines arranged to create at least two phase boundaries between the receiver circuit and the reflection circuit.

No direct-current (DC) offset may be applied to the input signal. A ratio of an inductance of the secondary winding and a resistance of the resistor may be selected such that only the edge transitions in the input signal generate enough current in the secondary winding for it to be output as the output signal. The superconducting circuit may be configured to, without requiring the DC offset, output the output signal corresponding to the edge transitions in the input signal regardless of variability of the data pattern.

The input signal may comprise comprises a non-return to zero signal and the output signal may comprise a return to zero signal. The non-return to zero signal may comprise a signal generated by a non-superconducting system and the return to zero signal may comprise SFQ pulses.

In yet another aspect, the present disclosure relates to a superconducting circuit comprising a receiver circuit configured to receive an input signal having a data pattern represented by edge transitions in the input signal, where the receiver circuit is configured to, without applying a direct-current (DC) offset to the input signal, output an intermediate signal, via a first node, corresponding to the edge transitions such that the intermediate signal is substantially representative of the data pattern despite not applying the DC offset to the input signal. The superconducting circuit may further include an output transmission circuit comprising a plurality of Josephson transmission lines, where the output transmission circuit is coupled to the first node to receive the intermediate signal and provide an output signal.

The receiver circuit may comprise a transformer including a primary winding of the transformer coupled to receive the input signal and a secondary winding of the transformer, and a resistor coupled between the secondary winding of the transformer and a ground terminal. A ratio of an inductance of the secondary winding and a resistance of the resistor may be selected such that only the edge transitions in the input signal generate enough current in the secondary winding for it to be provided as the intermediate signal. The superconducting circuit may be configured to provide the intermediate signal corresponding to the edge transitions in the input signal regardless of variability of the data pattern.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A superconducting circuit comprising:
a receiver circuit comprising a transformer including a primary winding of the transformer, coupled to receive the input signal, and a secondary winding of the transformer, wherein the receiver circuit further comprises a resistor coupled between the secondary winding of the transformer and a ground terminal, wherein the receiver circuit is configured to receive an input signal having a data pattern represented by edge transitions in the input signal, and wherein the receiver circuit is configured to output an intermediate signal, via a first node, corresponding to the edge transitions such that the intermediate signal is substantially representative of the data pattern;
an input transmission circuit coupled to the first node to receive the intermediate signal and provide single flux quantum (SFQ) pulses to a second node;
a reflection circuit coupled to the second node to receive the SFQ pulses and provide inverted SFQ pulses to the second node; and
an output transmission circuit coupled to the second node to receive both the SFQ pulses and the inverted SFQ pulses and provide the SFQ pulses and the inverted SFQ pulses as an output signal.

2. The superconducting circuit of claim 1, wherein the input transmission circuit is configured to block the inverted SFQ pulses from reaching the receiver circuit.

3. The superconducting circuit of claim 1, wherein the input transmission circuit comprises a plurality of Josephson transmission lines arranged to create at least two phase boundaries between the receiver circuit and the reflection circuit.

4. The superconducting circuit of claim 1, wherein no direct-current (DC) offset is applied to the input signal.

5. The superconducting circuit of claim 1, wherein a ratio of an inductance of the secondary winding and a resistance of the resistor is selected such that only the edge transitions in the input signal generate enough current in the secondary winding for it to be output as the output signal.

6. The superconducting circuit of claim 4, wherein the superconducting circuit is configured to, without requiring the DC offset, output the output signal corresponding to the edge transitions in the input signal regardless of variability of the data pattern.

7. The superconducting circuit of claim 1, wherein the input signal comprises a non-return to zero signal and the output signal comprises a return to zero signal.

8. The superconducting circuit of claim 7, wherein the non-return to zero signal comprises a signal generated by a non-superconducting system and the return to zero signal comprises SFQ pulses.

9. A superconducting circuit comprising:
a receiver circuit configured to receive an input signal having a data pattern represented by edge transitions in the input signal, wherein the receiver circuit is configured to, without applying a direct-current (DC) offset to the input signal, output an intermediate signal, via a first node, corresponding to the edge transitions such that the intermediate signal is substantially representative of the data pattern despite not applying the DC offset to the input signal; and
an output transmission circuit comprising a plurality of Josephson transmission lines, wherein the output transmission circuit is coupled to the first node to receive the intermediate signal and provide an output signal.

10. The superconducting circuit of claim 9, wherein the receiver circuit comprises a transformer including a primary winding of the transformer coupled to receive the input signal and a secondary winding of the transformer, and a resistor coupled between the secondary winding of the transformer and a ground terminal.

11. The superconducting circuit of claim 9, wherein a ratio of an inductance of the secondary winding and a resistance of the resistor is selected such that only the edge transitions in the input signal generate enough current in the secondary winding for it to be provided as the intermediate signal.

12. The superconducting circuit of claim 9, wherein the superconducting circuit is configured to provide the intermediate signal corresponding to the edge transitions in the input signal regardless of variability of the data pattern.

13. A superconducting circuit comprising:
a receiver circuit comprising a transformer including a primary winding of the transformer, coupled to receive the input signal, and a secondary winding of the transformer, wherein the receiver circuit further comprises a resistor coupled between the secondary winding of the transformer and a ground terminal, wherein the receiver circuit is configured to receive an input signal having a data pattern represented by edge transitions in the input signal, and wherein the receiver circuit is configured to output an intermediate signal, via a first node, corresponding to the edge transitions such that the intermediate signal is substantially representative of the data pattern;
an input transmission circuit coupled to the first node to receive the intermediate signal and provide single flux quantum (SFQ) pulses to a second node, wherein the input transmission circuit comprises a first plurality of Josephson transmission lines;

a reflection circuit coupled to the second node to receive the SFQ pulses and provide inverted SFQ pulses to the second node; and an output transmission circuit coupled to the second node to receive both the SFQ pulses and the inverted SFQ pulses and provide the SFQ pulses and the inverted SFQ pulses as an output signal.

14. The superconducting circuit of claim 13, wherein the input transmission circuit is configured to block the inverted SFQ pulses from reaching the receiver circuit.

15. The superconducting circuit of claim 13, wherein no direct-current (DC) offset is applied to the input signal.

16. The superconducting circuit of claim 13, wherein a ratio of an inductance of the secondary winding and a resistance of the resistor is selected such that only the edge transitions in the input signal generate enough current in the secondary winding for it to be output as the output signal.

17. The superconducting circuit of claim 16, wherein the superconducting circuit is configured to, without requiring the DC offset, output the output signal corresponding to the edge transitions in the input signal regardless of variability of the data pattern.

18. The superconducting circuit of claim 13, wherein the input signal comprises a non-return to zero signal and the output signal comprises a return to zero signal.

19. The superconducting circuit of claim 18, wherein the non-return to zero signal comprises a signal generated by a non-superconducting system and the return to zero signal comprises SFQ pulses.

20. The superconducting circuit of claim 13, wherein the output transmission circuit comprises a second plurality of Josephson transmission lines.

\* \* \* \* \*